United States Patent
Wu et al.

(10) Patent No.: US 10,968,508 B2
(45) Date of Patent: Apr. 6, 2021

(54) METHOD OF FABRICATING HYDROPHILIC-HYDROPHOBIC TRANSFORMABLE COMPOSITE FILM

(71) Applicants: TATUNG UNIVERSITY, Taipei (TW); Tatung Company, Taipei (TW)

(72) Inventors: Tair-I Wu, Taipei (TW); Chien-Lung Huang, Kaohsiung (TW)

(73) Assignees: TATUNG UNIVERSITY, Taipei (TW); Tatung Company, Taipei (TW)

( * ) Notice: Subject to any disclaimer, the term of this patent is extended or adjusted under 35 U.S.C. 154(b) by 293 days.

(21) Appl. No.: 15/983,118

(22) Filed: May 18, 2018

(65) Prior Publication Data

US 2018/0265962 A1     Sep. 20, 2018

Related U.S. Application Data

(62) Division of application No. 12/585,812, filed on Sep. 25, 2009, now Pat. No. 10,000,841.

(30) Foreign Application Priority Data

Apr. 27, 2009   (TW) ................................ 098113869

(51) Int. Cl.
       *C23C 14/14*       (2006.01)
(52) U.S. Cl.
       CPC ........... *C23C 14/14* (2013.01); *Y10T 428/256* (2015.01); *Y10T 428/26* (2015.01)
(58) Field of Classification Search
       CPC ......... C23C 14/14; C23C 20/00; C23C 20/06; C23C 28/04; C23C 28/40
       See application file for complete search history.

(56) References Cited

U.S. PATENT DOCUMENTS

| | | | | |
|---|---|---|---|---|
| 5,073,804 A | * | 12/1991 | Coleman | H01J 37/32541 257/30 |
| 5,618,619 A | * | 4/1997 | Petrmichl | C23C 16/0245 428/334 |
| 5,640,663 A | * | 6/1997 | Hirai | C23C 16/24 399/350 |
| 6,027,766 A | * | 2/2000 | Greenberg | C03C 17/23 427/226 |
| 6,690,031 B1 | * | 2/2004 | Ohtani | G02F 1/136213 257/71 |
| 2005/0267000 A1 | * | 12/2005 | Kerber | H01L 21/316 505/190 |
| 2008/0152826 A1 | * | 6/2008 | Crawford | C09K 11/7733 427/466 |
| 2009/0186230 A1 | * | 7/2009 | Sun | C23C 14/14 428/457 |

OTHER PUBLICATIONS

Caul et al "Microtexture Analysis of Interstitial-Free Steel" Materials Characterization 38: 155-167 (1997) (Year: 1997).*
Nocun et al "Sodium Diffusion barrier coatings prepared by sol-gel method" Optica Applicata, vol. XXXVIII, 38 (1), Jan. 2008 (Year: 2008).*
Permpoon et al. "Photo-Induced Hydrophilicity of TiO2 Films Deposited on Stainless Steel via Sol-gel Technique" J. Sol-Gel Sci. and Tech. 35, 127-136, (c) 2005 (Year: 2005).*
Seki et al "Kinetic of Photoinduced Hydrophilic Conversion Processes of TiO2 Surfaces" J. Phys. Chem. B. 2004, 108, 4806-4810 (Year: 2004).*
Yu et al "Effect of surface treatment on the Photocatalytic Activity and Hydrophilic Property of the sol-gel derived TiO2 thin films" Mat. Res. Bull. 36 (2001) 97-107 (Year: 2001).*
J.T.Chang et al., "Photocatalytic performance of chromium or nitrogen doped arc ion plated-TiO2 films," Surface and Coatings Technology, vol. 200, Issues 5-6, Nov. 21, 2005, pp. 1640-1644.
T. Y. Tseng et al., "The Effects of the Interlayer on the Properties of TiO2 Coatings on IF Steel," heat treatment of metal, vol. 89, 2006, pp. 19-29.
C.L.Lin et al., "Effects of sputtered Si Interlayer on the Hydrophilicity of TiO2 coatings on IF steels," heat treatment of metal, vol. 102, 2009, pp. 45-57.

* cited by examiner

*Primary Examiner* — Nathan H Empie
(74) *Attorney, Agent, or Firm* — JCIPRNET

(57) ABSTRACT

A method of fabricating a hydrophilic-hydrophobic transformable composite film is provided. The method includes forming a silicon-containing layer on an iron-containing substrate; coating a titanium-containing sol-gel film on the said silicon-containing layer; and heating the iron-containing substrate with the silicon-containing layer and the titanium-containing sol-gel film thereon.

9 Claims, No Drawings

METHOD OF FABRICATING HYDROPHILIC-HYDROPHOBIC TRANSFORMABLE COMPOSITE FILM

CROSS-REFERENCE TO RELATED APPLICATION

This application is a divisional application of and claims the priority benefit of U.S. application Ser. No. 12/585,812, filed on Sep. 25, 2009, now pending, which claims the priority benefit of Taiwan application serial no. 098113869, filed on Apr. 27, 2009. The entirety of each of the above-mentioned patent applications is hereby incorporated by reference herein and made a part of specification.

BACKGROUND OF THE INVENTION

1. Field of the Invention

The present invention relates to a hydrophilic-hydrophobic transformable composite film and, more particularly, to a hydrophilic-hydrophobic transformable composite film switched by UV light illumination.

2. Description of Related Art

In many situations, the ability to control the surface wettability of solid substrate is very important. In 1972, Fujishima and Honda constructed an electrochemical cell in which a $TiO_2$ electrode was connected with a platinum electrode through an external circuit. When the surface of the $TiO_2$ electrode was irradiated, current flowed from the platinum electrode to the $TiO_2$ electrode through the external circuit. The direction of the current reveals that the oxidation reaction occurs at the $TiO_2$ electrode and the reduction reaction occurs at the platinum electrode. Thereby, Fujishima and Honda suggested that even without the application of any external voltage, water could be decomposed into hydrogen and oxygen by visible light (A. Fujishima and K. Honda, Nature, 238 (1972) 37-38). Since then, significant amounts of research involved with solar energy transformation, and photochemical catalysis, synthesis, and degradation have been widely performed.

Anatase titanium oxide has many advantages such as excellent light-catalysis activity, UV light-excited catalysis activity, self-cleaning property, anti-bacterial property, anti-fogging property, and super-hydrophilicity and therefore has been applied into many types of sanitary equipment manufacture. Among these properties, the photocatalytic properties result from the promotion of electrons (on the surfaces of $TiO_2$ layer) from the valance band to the conduction band under the influence of ultraviolet (UV) or near-UV radiation. Then the hydroxyl free radical or oxygen free radical ($O^{2-}$) generated may further react with organic matters or water and undergo a series of photocatalytic reactions.

The super-hydrophilicity results from the repulsion between the excited electrons and the oxygen atoms locating on the outer surface of the $TiO_2$ layer. An abundance of oxygen-holes is created after the leaving of oxygen atoms, and following with the refilling of the oxygen-holes with the water molecules. The hydrogen atoms of those water molecules bind to the oxygen atoms of $TiO_2$ molecules having strong reducing activity and therefore a large amount of hydroxyl group forms on the $TiO_2$ layer. Consequently, a $TiO_2$ layer with super-hydrophilicity on the surface is formed.

Anatase titanium oxide is usually in a form of nano particles, which need to be immobilized before practical usage. Accordingly, reactivity and durability should be considered for the immobilization process. When an organic substrate is used, the decomposition of organic substrate itself should be concerned first. Meanwhile, if an inorganic substrate is used, the surfaces of the photo-catalyst may be shielded, thus, results in the lowering of the catalytic efficiency. Therefore, the immobilizing method of anatase titanium oxide is still a challenge to those skilled in this art and thus is of particular interest to researchers.

The $TiO_2$ coating layer applied to the fabrication of commercial products such as sanitary equipment usually has only single hydrophilic property, either hydrophilic or super-hydrophilic, but does not has hydrophilic-hydrophobic transformation ability, and therefore is limited in many application situations. For example, the cleaning efficiency cannot be largely improved if only hydrophilic property appears in the outer coating layer of the sanitary equipment.

Hence, it is desirable to provide an improved hydrophilic-hydrophobic transformable composite film that the hydrophilic or hydrophobic property thereof can be changed by a simple step, and can be applied into the fabrication of several kinds of apparatus such as sanitary equipment, vehicle outer shells, or exterior wall tiles, and this improves the cleaning efficiency of those applied usages.

SUMMARY OF THE INVENTION

The present invention provides a hydrophilic-hydrophobic transformable composite film, which comprises an iron-containing substrate; a silicon-containing layer formed on the iron-containing substrate; and a titanium oxide layer formed on the silicon-containing layer.

The hydrophilic and hydrophobic properties of the present composite film are switched by UV light illumination. In detail, the composite film is hydrophobic before being exposed to UV light, but changes to hydrophilic after being exposed to UV light, and changes back to hydrophobic after removing the UV source for a period of time (for example, about 24 hours). According to contact angle testing results, a great difference between contact angles of the present composite films before and after exposing to UV light is shown, which proves the excellent hydrophilic-hydrophobic transforming ability of the composite films of the present invention.

According to the hydrophilic-hydrophobic transformable composite film of the present invention, the silicon-containing layer may preferably be a silicon layer, a silicon oxide layer, or a combination thereof.

According to the hydrophilic-hydrophobic transformable composite film of the present invention, the iron-containing substrate is not specially limited, and can be made of one selected from the group consisting of: interstitials free (IF) steel, transformation induced plasticity (TRIP) steel, dual phase (DP) steel, Twinning Induced Plasticity (TWIP) steel, high strength (HS) steel, high strength low alloy (HSLA) steel, ceramics doped with iron, and glass doped with iron. The iron-containing substrate preferably is made of interstitials free (IF) steel due to its low price and being easily commercially reachable.

According to the hydrophilic-hydrophobic transformable composite film of the present invention, the silicon-containing layer formed on the iron-containing substrate can be made by sputtering or by a sol-gel process, but preferably is made by sputtering.

According to the hydrophilic-hydrophobic transformable composite film of the present invention, the titanium oxide layer is preferably made by sol-gel process in order to adjust the thickness of the titanium-containing sol-gel film to enable the forming of porous film (anatase titanium oxide) that further becomes an excellent catalyst. The porous film (anatase titanium oxide) is advanced in many advantages comprising (1) good solidifying ability; (2) well-controlled particle size of $TiO_2$ particles wherein the minimum particle size is 100 nm or less, which may result in excellent quantum effect; and (3) high uniformity of $TiO_2$ particle distribution that means the aggregation phenomenon is reduced, which results in the increasing of the contact area (exposing area) to UV light and providing an evident photo-catalyticity. Besides, the thickness of the titanium oxide layer preferably is 0.1~1 μm, more preferably is 0.2~0.4 μm. The particle size of the titanium oxide particle preferably is 100 nm or less.

The present invention also provides a method of fabricating a hydrophilic-hydrophobic transformable composite film, which comprises (A) forming a silicon-containing layer on an iron-containing substrate; (B) coating a titanium-containing sol-gel film on the said silicon-containing layer; and (C) heating the iron-containing substrate with the silicon-containing layer and the titanium-containing sol-gel film thereon. Thereby, a hydrophilic-hydrophobic transformable composite film can be easily fabricated by the method of the present invention. The hydrophilic and hydrophobic properties of the composite film fabricated are switched by UV light illumination. In detail, the composite film is hydrophobic before being exposed to UV light, but changes to hydrophilic after being exposed to UV light, and changes back to hydrophobic after removing the UV source for a period of time, for example, about 24 hours.

According to the method of the present invention, the silicon-containing layer may preferably be a silicon layer, a silicon oxide layer, or a combination thereof.

According to the method of the present invention, the iron-containing substrate is not specially limited, and can be made of one selected from the group consisting of: interstitials free (IF) steel, transformation induced plasticity (TRIP) steel, dual phase (DP) steel, Twinning Induced Plasticity (TWIP) steel, high strength (HS) steel, high strength low alloy (HSLA) steel, ceramics doped with iron, and glass doped with iron. The iron-containing substrate preferably is made of interstitials free (IF) steel due to its low price and being easily commercially reachable.

According to the method of the present invention, the step (B) is preferably repeated once or more, for example, the titanium-containing sol-gel can be coated on the silicon-containing layer for twice, three times, or more in order to adjust the thickness of the titanium-containing sol-gel film to enable the forming of porous film (anatase titanium oxide) that further becomes an excellent catalyst. The titanium-containing sol-gel is preferably made by titanium-containing precursor such as TIP (titanium isopropoxide) or TTIP (titanium tetraisopropoxide).

According to the method of the present invention, the silicon-containing layer in the step (A) is preferably formed by sputtering or coating, more preferably by sputtering, a silicon-containing sol-gel (e.g. TEOS (tetraethoxysilane)) on the iron-containing substrate following with drying process.

According to the method of the present invention, the heating temperature of step (C) is preferably 350~450° C., more preferably 400° C.

Other objects, advantages, and novel features of the invention will become more apparent from the following detailed description when taken in conjunction with the accompanying drawings.

BRIEF DESCRIPTION OF THE DRAWINGS

Detailed Description of the Preferred Embodiment

Example 1

Preparation of Titanium-Containing Sol-Gel 0.025 mol of titanium isopropoxide (TIP) is added to 30 ml of isopropyl alcohol (IPA), 0.01 mol of 2-ethylcaproic acid (EA) and 0.6 g of polyethylene glycol (PEG) is then added thereto. Isopropyl alcohol is added to dilute the above mixture volume to 50 ml followed with 2 hrs of ultrasonic mixing, thus the titanium-containing sol-gel is prepared.

Preparation of Hydrophilic-Hydrophobic Transformable Composite Film

A silicon layer is formed on a pre-cleaning substrate by using a sputtering process, in which the sputtering conditions are as following.

Distance between the target and the substrate: 5 cm
Processing time: 20 min
Chamber bottom pressure: $3.5 \times 10^{-5}$ torr
Working pressure: $8.5 \times 10^{-3}$ torr
Argon flow rate: 30 sccm
Operating power: 125 W The silicon layer made by sputtering may have a preferred heat resistance, but the method of making the silicon layer is not limited thereto. Subsequently, the prepared titanium-containing sol-gel is coated twice at 1500 rpm on the above substrate having the silicon layer formed thereon. Further, the substrate is heated at 400° C. (the pre-heating rate is 5° C./min) for 1 hour of calcination followed with furnace cooling to the room temperature. Therefore, the hydrophilic-hydrophobic transformable composite film of the present example is fabricated.

The hydrophilic and hydrophobic properties of the present composite film are switched by UV light illumination. In detail, the composite film is hydrophobic before being exposed to UV light, but changes to hydrophilic after being exposed to UV light, and changes back to hydrophobic after releasing without further exposure to UV light in a period of time, for example, about 24 hours.

The substrate used in the present example should be an iron-containing substrate, which can be made of stainless steel or interstitials free (IF) steel etc. Because interstitials free (IF) steel is a commercially reachable material with low price, an iron-containing substrate made of interstitials free (IF) steel is used in the present example.

The coating times of the titanium-containing sol-gel film on the silicon layer, which is formed on the iron-containing substrate, are not limited. The titanium-containing sol-gel film can be coated on the silicon layer for once, twice, three times, or more in order to adjust the thickness of the titanium-containing sol-gel film to enable the forming of porous film (anatase titanium oxide) that further becomes an excellent catalyst. The porous film is advanced in many advantages comprising (1) good solidifying ability; (2) well-controlled particle size of $TiO_2$ particles wherein the minimum particle size is 100 nm or less, which may result in excellent quantum effect; and (3) high uniformity of $TiO_2$ particle distribution that means the aggregation phenomenon is reduced, which results in the increasing of the contact area with UV light.

Example 2

The same method as described in Example 1 is used to fabricate the hydrophilic-hydrophobic transformable composite film of the present example, except that the coating of the titanium-containing sol-gel film is performed three times instead of twice and the silicon layer is replaced by a silicon oxide layer.

According to the three-times-coated titanium-containing sol-gel film, the distribution depth of the Ti element is 1.3 µm and the concentration in the depth of 1.0 µm is about 10 at. % after being calcined.

Example 3

Preparation of Titanium-Containing Sol-Gel 0.025 mol of titanium isopropoxide (TIP) is added to 30 ml of isopropyl alcohol (IPA), 0.01 mol of 2-ethylcaproic acid (EA) and 0.6 g of polyethylene glycol (PEG) is then added thereto. Isopropyl alcohol is added to dilute the above mixture volume to 50 ml followed with 2 hrs of ultrasonic mixing, thus the titanium-containing sol-gel is obtained.

Preparation of Silicon Oxide Sol-Gel 5 ml of 0.1N acetic acid and 0.025 mol of tetraethoxysilane (TEOS) is added to 30 ml of isopropyl alcohol. After mixing, more isopropyl alcohol is added to dilute the above mixture volume to 50 ml to form the silicon sol-gel.

Preparation of Hydrophilic-Hydrophobic Transformable Composite Film

The above-prepared silicon sol-gel is coated on a pre-cleaned interstitials free (IF) steel substrate followed with drying. Then, a titanium-containing sol-gel film is formed by coating the titanium-containing sol-gel for three times on the dried silicon sol-gel layer following with heating at 400° C. (the pre-heating rate is 5° C./min) for 1 hour of calcination. Finally, the substrate is subjected to furnace cooling to the room temperature, thus the hydrophilic-hydrophobic transformable composite film of the present example is obtained.

Comparative Example 1

A pre-cleaned interstitials free (IF) steel substrate is heated at 400° C. (the pre-heating rate is 5° C./min) for 1 hour followed with furnace cooling to the room temperature. Accordingly, the sample of the present comparative example is prepared.

Comparative Example 2

Use the same method as described in Example 1 to prepare titanium-containing sol-gel, then coat the prepared titanium-containing sol-gel on a pre-cleaning interstitials free (IF) steel substrate. The coated IF steel substrate is then heated at 400° C. (the pre-heating rate is 5° C./min) for 1 hour of calcination followed with furnace cooling to the room temperature. Accordingly, the sample of the present comparative example is prepared.

Experiment Example 1

Take the hydrophilic-hydrophobic transformable composite films of Examples 1 and 3, and the samples of Comparative Examples 1 and 2 for water-contacting angle test to compare the contact angles of those films and samples before and after exposing to UV light. The results are listed in Table 1.

TABLE 1

|  | Contact angle before UV light exposing | Contact angle after UV light exposing |
| --- | --- | --- |
| Example 1 | 93.10° | 0° |
| Example 3 | 99.36° | 25.85° |
| Comparative Example 1 | 117.08° | 110.00° |
| Comparative Example 2 | 133.99° | 107.65° |

According to the results of Examples 1 and 3 shown in Table 1, a great difference between contact angles of the films before and after exposing to UV light is shown, in which the contact angle of the film made from Example 1 after exposing to UV light is 0°, which means the hydrophilic-hydrophobic transformable composite film of Example 1 is completely changed to hydrophilic after exposing to UV light. Namely, from the testing results, it is shown that the composite film of the present invention has excellent hydrophilic-hydrophobic transforming ability.

Comparing the testing results of composite films of Examples 1 and 3, it can be seen that the composite film in which the silicon-containing layer is formed by sputtering (Example 1) shows a better hydrophilic-hydrophobic transforming ability compared to the composite film in which the silicon-containing layer is formed by sol-gel process (Example 3).

However, there is no apparent hydrophilic-hydrophobic transforming shown from testing results of Comparative Examples 1 and 2 before and after UV light illuminating, which means substrates having titanium-containing sol-gel films but no silicon-containing layer formed thereon can not obtain the expected hydrophilic-hydrophobic transforming ability.

As mentioned above, the hydrophilic-hydrophobic transformable composite film of the present invention has excellent hydrophilic-hydrophobic transforming efficiency wherein the hydrophilic-hydrophobic transforming is switched by UV light exposing. The composite film of the present invention is hydrophobic before being exposed to UV light, but changes to hydrophilic after being exposed to UV light, and changes back to hydrophobic after releasing without further exposure to UV light in a period of time. Moreover, the contact angle of the composite film of the present invention after exposing to UV light is 0°, which means the composite film is completely changed to hydrophilic after exposing to UV light and such phenomenon cannot be reached by the prior arts.

The hydrophilic-hydrophobic transformable composite film of the present invention can be extensively applied into the fabrication of various apparatus such as sanitary equipment, vehicle outer shells, exterior wall tiles, etc., and therefore can improve the self-cleaning property of these apparatus when being applied. Accordingly, the hydrophilic-hydrophobic transformable composite film and the method fabricating thereof are indeed more practical than the material of merely hydrophilic properties of the prior arts.

Although the present invention has been explained in relation to its preferred embodiment, it is to be understood that many other possible modifications and variations can be made without departing from the scope of the invention as hereinafter claimed.

What is claimed is:

1. A method of fabricating a hydrophilic-hydrophobic transformable composite film, comprising:
   (A) forming a silicon layer, by a sputtering process, on an iron-containing substrate;
   (B) spin-coating a titanium-containing sol-gel film on the said silicon layer for twice or more; and
   (C) heating the iron-containing substrate with the silicon containing layer and the titanium-containing sol-gel film thereon after the step (B) such that the titanium-containing sol-gel film is formed into a porous film,
   wherein the iron-containing substrate is made of interstitials free (IF) steel, and the porous film is formed of anatase titanium oxide; and
   wherein sputtering conditions of the sputtering process are as follows:
   the distance between a target and the iron-containing substrate is 5 cm,
   the processing time is 20 minutes,
   the chamber bottom pressure is $3.5 \times 10^{-5}$ torr,
   the working pressure is $8.5 \times 10^{-3}$ torr,
   the argon flow rate is 30 sccm,
   and the operating power is 125 W.

2. The method as claimed in claim 1, wherein the heating temperature of step (C) is 350° C.~450° C.

3. The method as claimed in claim 2, wherein the heating temperature of step (C) is 400° C.

4. The method as claimed in claim 1, wherein a titanium-containing sol-gel of the titanium-containing sol-gel film is titanium isopropoxide sol-gel, or titanium tetraisopropoxide sol-gel.

5. The method as claimed in claim 1, wherein the step (C) is heating the iron-containing substrate with the silicon layer and the titanium-containing sol-gel film thereon by a furnace.

6. The method as claimed in claim 5, wherein a pre-heating rate of the step (C) is 5° C./min, and the heating temperature of the step (C) is 400° C.

7. The method as claimed in claim 6, wherein the heating time of the step (C) is 1 hour.

8. The method as claimed in claim 1, further comprising:
   (D) cooling the iron-containing substrate with the silicon containing layer and the porous film thereon.

9. The method as claimed in claim 1, wherein a titanium-containing sol-gel of the titanium-containing sol-gel film contains titanium isopropoxide, isopropyl alcohol, 2-ethyl-caproic acid, and polyethylene glycol.

* * * * *